United States Patent
Song

(10) Patent No.: US 9,159,576 B2
(45) Date of Patent: Oct. 13, 2015

(54) METHOD OF FORMING FINFET HAVING FINS OF DIFFERENT HEIGHT

(71) Applicant: QUALCOMM Incorporated, San Diego, CA (US)

(72) Inventor: Stanley Seungchul Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 13/784,867

(22) Filed: Mar. 5, 2013

(65) Prior Publication Data

US 2014/0252474 A1 Sep. 11, 2014

(51) Int. Cl.
*H01L 21/308* (2006.01)
*H01L 29/66* (2006.01)
*H01L 21/762* (2006.01)
*H01L 21/32* (2006.01)

(52) U.S. Cl.
CPC ............ *H01L 21/3081* (2013.01); *H01L 21/32* (2013.01); *H01L 21/76205* (2013.01); *H01L 29/66795* (2013.01)

(58) Field of Classification Search
CPC .................. H01L 29/66795; H01L 29/66803; H01L 29/6681; H01L 29/66818; H01L 29/785; H01L 29/7851; H01L 29/7853; H01L 29/7854; H01L 29/7855; H01L 29/7856
See application file for complete search history.

(56) References Cited

U.S. PATENT DOCUMENTS

| | | | |
|---|---|---|---|
| 4,965,221 A | 10/1990 | Dennison et al. | |
| 5,629,242 A | 5/1997 | Nagashima et al. | |
| 6,046,483 A | 4/2000 | Tesauro et al. | |
| 6,909,147 B2 | 6/2005 | Aller et al. | |
| 6,970,372 B1 * | 11/2005 | Furukawa et al. | 365/149 |
| 6,977,194 B2 * | 12/2005 | Belyansky et al. | 438/197 |
| 6,977,404 B2 * | 12/2005 | Katsumata et al. | 257/301 |
| 7,470,570 B2 * | 12/2008 | Beintner et al. | 438/149 |
| 7,544,994 B2 | 6/2009 | Schepis et al. | |
| 7,709,303 B2 | 5/2010 | Burnett et al. | |

(Continued)

FOREIGN PATENT DOCUMENTS

| | | |
|---|---|---|
| DE | 19836164 A1 | 5/1999 |
| GB | 2312552 A | 10/1997 |
| WO | 9717729 A1 | 5/1997 |

OTHER PUBLICATIONS

International Search Report and Written Opinion—PCT/US2014/020402—ISA/EPO—May 22, 2014.

(Continued)

*Primary Examiner* — Anthony Ho
*Assistant Examiner* — Samuel Lair
(74) *Attorney, Agent, or Firm* — Muncy, Geissler, Olds & Lowe, P.C.

(57) ABSTRACT

A method is performed on a silicon-on-insulator (SOI) wafer formed of a substrate, a bottom oxide layer on the substrate and an active silicon layer on the bottom oxide layer, where the active silicon layer has a surface opposite the bottom oxide layer. The method includes forming a first mask over the surface at a first portion of the wafer and leaving a second portion of the wafer unmasked, etching the wafer at the unmasked second portion of the wafer to form a depression in the active silicon layer, the depression having a bottom, forming a thermal oxide layer substantially filling the depression, removing the first mask, and forming fins at the first and second portions of the wafer.

9 Claims, 6 Drawing Sheets

(56) References Cited

U.S. PATENT DOCUMENTS

| | | | |
|---|---|---|---|
| 7,847,323 B2* | 12/2010 | Cheng et al. | 257/288 |
| 7,902,035 B2* | 3/2011 | Yu et al. | 438/424 |
| 8,039,326 B2* | 10/2011 | Knorr et al. | 438/157 |
| 8,361,894 B1 | 1/2013 | Hargrove et al. | |
| 8,431,466 B2* | 4/2013 | Lin et al. | 438/443 |
| 8,497,198 B2* | 7/2013 | Chien et al. | 438/587 |
| 2004/0222477 A1 | 11/2004 | Aller et al. | |
| 2007/0257319 A1 | 11/2007 | Xiong et al. | |
| 2009/0032183 A1 | 2/2009 | Gilligan et al. | |
| 2009/0057846 A1 | 3/2009 | Doyle et al. | |
| 2012/0049284 A1 | 3/2012 | Doris et al. | |
| 2012/0241818 A1* | 9/2012 | Kavalieros et al. | 257/192 |
| 2013/0181263 A1* | 7/2013 | Cai et al. | 257/288 |
| 2013/0334602 A1 | 12/2013 | Guo et al. | |
| 2014/0291770 A1* | 10/2014 | Yin et al. | 257/397 |

OTHER PUBLICATIONS

Tsai H.H., et al., "An Evaluation of Furox Isolation Technology for VLSI/nMOSFET Fabrication", IEEE Transactions on Electron Devices, IEEE Service Center, Piscataway, NJ, US, vol. 35, No. 3, Mar. 1, 1988, pp. 275-284, XP000835550, ISSN: 0018-9383, DOI: 10.1109/16.2451 the whole document.

* cited by examiner

METHOD OF FORMING FINFET HAVING FINS OF DIFFERENT HEIGHT

FIELD OF THE DISCLOSURE

The present disclosure is directed to a method of forming a finned field effect transistor (finFET) having fins of different height and toward a finFET formed thereby, and, more specifically, toward a method of forming a finFET on a silicon-on-insulator (SOI) substrate which method includes etching a depression in a surface of the SOI substrate and forming an oxide layer in the etched depression and toward a finFET formed thereby.

BACKGROUND

A finned field effect transistor (finFET) is a FET that includes a fin-shaped channel region. A gate structure intersects the channel region, and the ends of the fin structure receive source and drain doping. The dimensions of the fin affect the operation of a finFET. For example, the length of the fin under the gate, measured in the direction from source to drain, determines the effective channel length of the device. It is desirable to form fins having a consistent height, and forming a finFET on a silicon-on-insulator (SOI) wafer provides improved fin height uniformity. This improved uniformity may be important as fin height scales.

For various applications, including system on chip (SOC) operation, it is useful to make finFETs with fins having at least two different heights. When bulk silicon is used, fin height can be controlled by removing different amounts of the shallow trench isolation (STI) oxide layer around different groups of fins. Essentially, all fins have the same height when measured from the underlying silicon layer, but different amounts of the STI oxide region are left around different fins so that different heights of the fins are left projecting from the STI layer. However, when an SOI wafer is used, the thickness of the silicon layer is predetermined, and the conventional method cannot be used without modification to achieve different fin heights. Instead, it may be necessary to form an STI layer on the SOI active silicon layer, mask the area over a fin that is to be a shorter fin and selectively etch the STI layer around another fin to form a taller fin, which is similar to the method used in bulk substrate and that undermines the intended benefit of finFET on SOI substrate.

Another known method for forming a finFET on an SOI wafer with fins having different heights is illustrated in FIGS. 1-6. FIG. 1 illustrates a conventional SOI wafer 100 that includes a substrate 102, a bottom oxide (BOX) layer 104 and an active silicon layer 106 having a top surface 108. In FIG. 2, a hardmask 202, which may comprise silicon nitride, for example, is formed on the top surface 108, and a patterned resist 204 is formed on the hardmask so that a first portion 206 of the SOI wafer 100 is masked and a second portion 208 of the SOI wafer 100 is not masked. In FIG. 3, the portion of the hardmask 202 that is not protected by the resist 204 is etched down to the top surface 108. With the top surface 108 exposed and the first portion 206 of the SOI wafer 100 protected, the top surface 108 is oxidized to form a depression 402 filled with a top oxide layer 404 as illustrated in FIG. 4. The oxidation process produces a generally symmetric oxide layer 404 which projects upwardly beyond the top surface 108 of the active silicon layer 106 about as far as it projects downwardly into the active silicon layer 106.

FIG. 5 shows the SOI wafer 100 after the hardmask 202 and patterned resist 204 have been removed at which time a first plurality of masks 502 are formed in the first portion 206 of the SOI wafer 100 and a second plurality of masks 504 are formed in the second portion 208 of the SOI wafer 100 on the top oxide layer 404. The silicon not protected by the first plurality of masks 502 in the first portion 206 and the silicon and oxide not protected by the second plurality of masks 504 in the second portion 208 are etched away to produce a plurality of fins. FIG. 6 illustrates a first plurality of fins 602 in the first portion 206 of the SOI wafer 100 that are taller than a second plurality of fins 604 in the second portion 208 of the SOI wafer 100. While this method may produce fins for a finFET that are acceptable for some applications, the uneven top surface created by the top oxide layer 404 protruding from the top surface 108 of the active silicon layer 106 may make it difficult to apply masks for later forming the first and second plurality of fins.

It would therefore be desirable to provide a method of forming fins on an SOI wafer that have different heights in a manner that does not require the addition of an STI layer to the SOI wafer and that provides a substantially even surface on which to form a mask for forming the different height fins.

SUMMARY

A first exemplary embodiment of the invention comprises a method that includes providing a silicon-on-insulator (SOI) wafer comprising a substrate, a bottom oxide layer on the substrate and an active silicon layer on the bottom oxide layer, the active silicon layer having a surface opposite the bottom oxide layer. The method also includes forming a first mask over the surface at a first portion of the wafer and leaving a second portion of the wafer unmasked, etching the wafer at the unmasked second portion of the wafer to form a depression in the active silicon layer, the depression having a bottom, forming a thermal oxide layer substantially filling the depression, removing the first mask, and forming fins at the first and second portions of the wafer.

Another exemplary embodiment comprises a device that includes an SOI wafer having a silicon layer having a top surface, the SOI wafer having a first portion and a second portion. The second portion includes an etched depression having an oxidized bottom and an oxide layer in the etched depression having an oxide layer top surface, where the oxide layer top surface is substantially even with the silicon layer top surface. The device also includes a plurality of mask portions on the silicon layer top surface and on the oxide layer top surface for defining a first plurality of fins at the first SOI wafer portion and a second plurality of fins at the second SOI wafer portion.

A further exemplary embodiment comprises a method that includes steps for providing an SOI wafer having a silicon layer having a surface, steps for forming a first mask on the surface at a first portion of the wafer and leaving a second portion of the wafer unmasked, steps for etching the wafer at the unmasked second portion of the wafer to form a depression having a bottom, steps for forming an oxide layer substantially filling the depression, steps for removing the first mask and steps for forming fins at the first and second portions of the wafer.

An additional exemplary embodiment comprises a non-transient computer readable medium containing instructions that, when executed by a computer processor cause a device controlled by the computer processor to perform actions on an silicon SOI wafer comprising a substrate, a bottom oxide layer on the substrate and an active silicon layer on the bottom oxide layer, the active silicon layer having a surface opposite the bottom oxide layer. The actions include forming a first mask over the surface at a first portion of the wafer and leaving a second portion of the wafer unmasked, etching the wafer at the unmasked second portion of the wafer to form a depression in the active silicon layer, the depression having a bottom, forming a thermal oxide layer substantially filling the depression, removing the first mask and forming fins at the first and second portions of the wafer.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
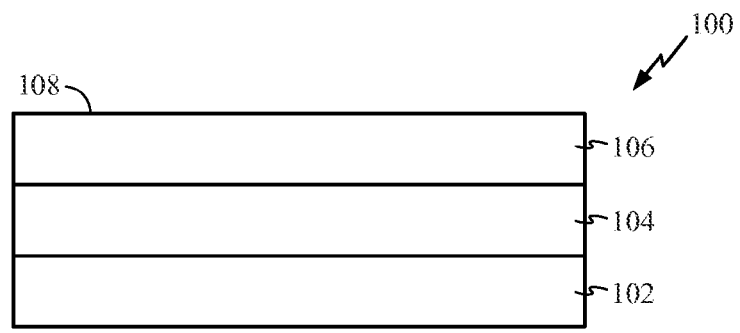
FIGS. 1-6 are schematic side elevational views of a silicon-on-insulator (SOI) wafer as various conventional processes are performed thereon to form fins having different heights.
Figure 2:
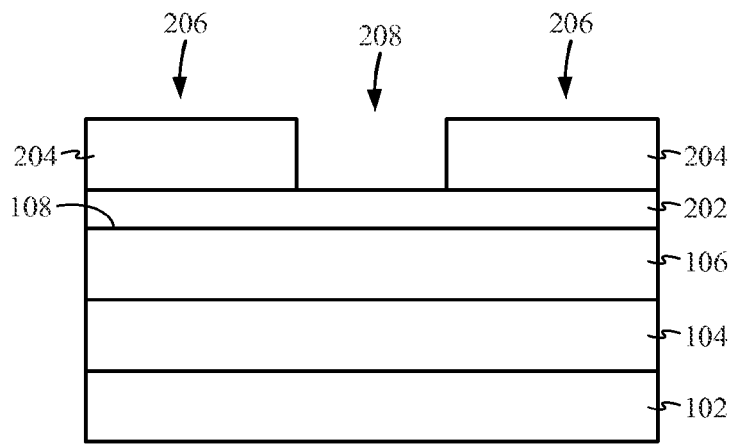
Figure 3:
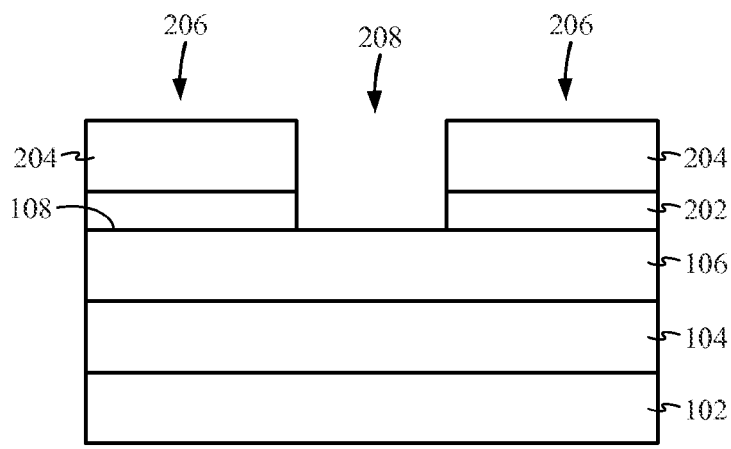
Figure 4:
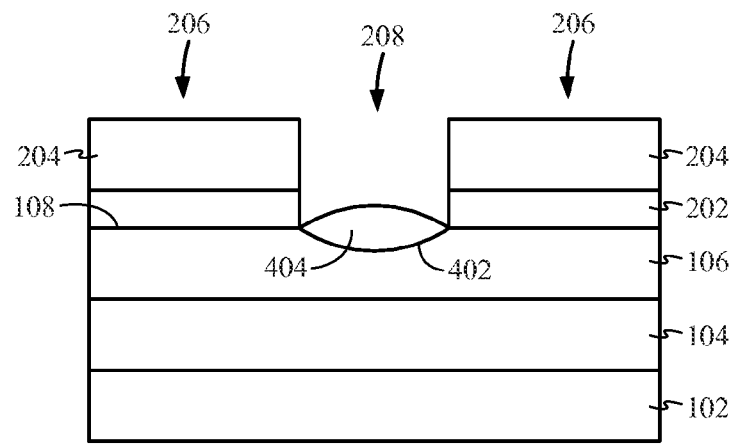
Figure 5:
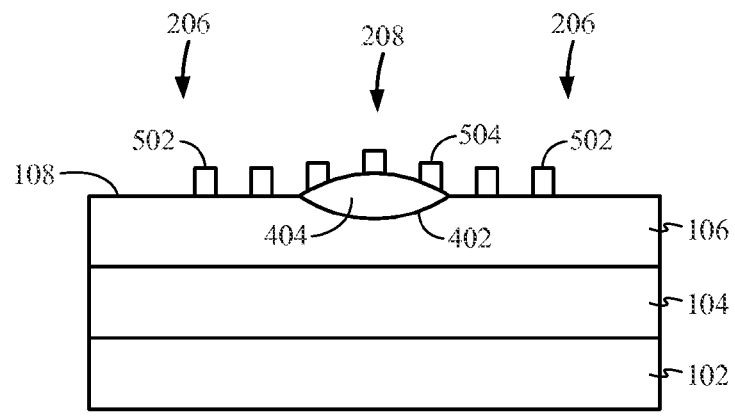
Figure 6:
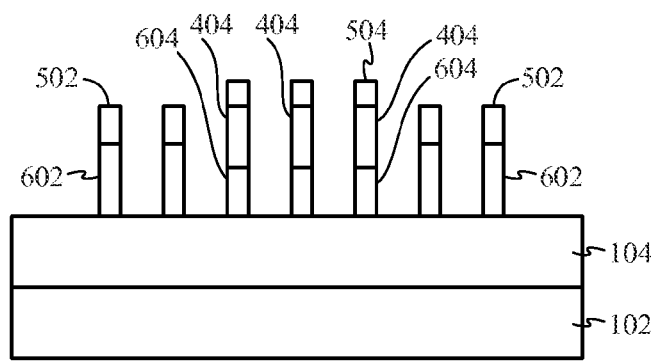
Figure 7:
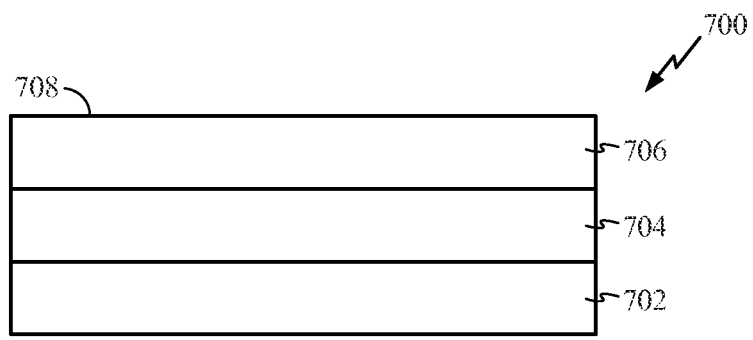
FIGS. 7-12 are schematic side elevational views of an SOI wafer as various processes according to an embodiment of the disclosure are performed thereon to form fins having different heights.
Figure 8:
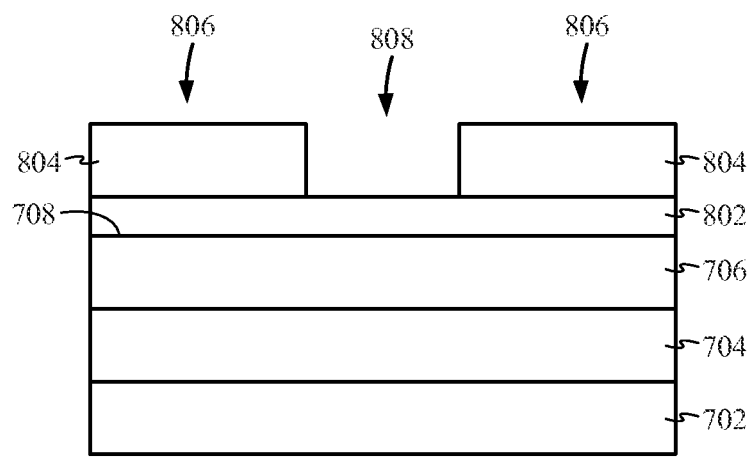
Figure 9:
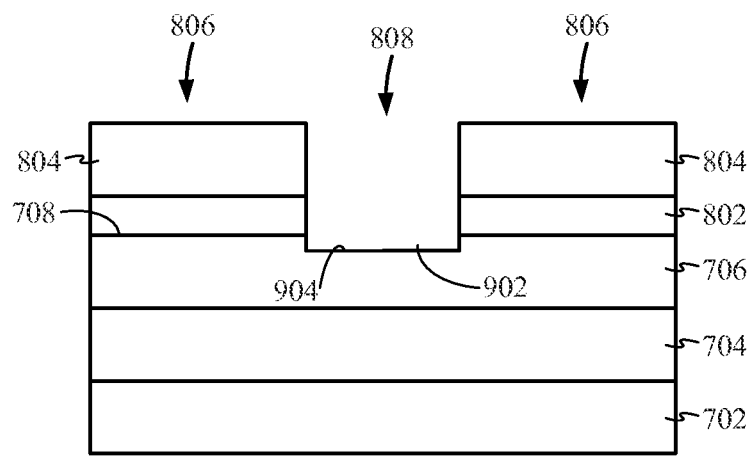

FIG. 7 illustrates an SOI wafer 700 that includes a substrate 702, a bottom oxide layer 704 and an active silicon layer 706 having a top surface 708. In FIG. 8, a hardmask 802, which may comprise silicon nitride, is formed on the top surface 708, and a patterned resist 804 is formed on the hardmask 802 so that a first portion 806 of the SOI wafer 700 is masked and a second portion 808 of the SOI wafer 700 is not masked. An etching process, which may comprise a dry etching process using, for example, an etchant gas containing F, Br, or Cl such as $SF_6$, HBr, and $Cl_2$, or a wet etching process, for example, using EDP (EthyleneDiamine Pyrocatechol), KOH, TMAH (Tetramethyl ammonium hydroxide), or mixture of $HF+HNO_3+CH_3COOH$, or a dry etch followed by a wet etch, is then performed. This etches away the exposed hardmask 802 in the second portion 808 of the wafer and, in addition, as illustrated in FIG. 9, etches a depression 902 having a bottom 904 in the top surface 708 of the active silicon layer 706 of the SOI wafer 700. This etching process is not an oxidation process, but rather a process of physically or chemically removing a portion of the active silicon layer 706 in the second portion 808 of the SOI wafer 700 in preparation for a subsequent oxidation process discussed below.

Figure 10:
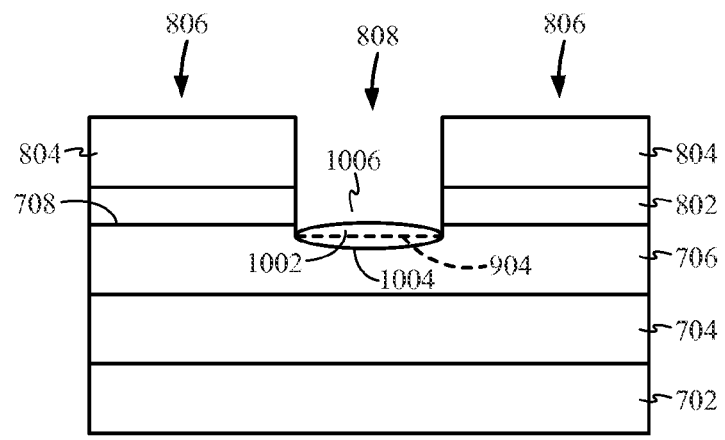

After the aforementioned etching process, the bottom 904 of the depression 902 is oxidized as illustrated in FIG. 10 with an oxidation process that forms a thermal oxide layer 1002 and which process deepens the depression 902, forming a new bottom 1004 of the depression 902 closer to the bottom oxide layer 704. The bottom 904 of the depression 902 as it existed before the oxidation process is illustrated in FIG. 10 with dashed lines. The oxidation process produces a generally symmetric thermal oxide layer 1002, and the thermal oxide layer 1002 grows upwardly at about the same rate as the depth of the depression 902 increases. The oxidation process is stopped when the top surface 1006 of the thermal oxide layer 1002 is generally even with the top surface 708 of the active silicon layer 706 and when the depression 902 is substantially filled with the thermal oxide layer 1002. Next the patterned resist 804 is removed, for example, by an oxygen based ashing process or wet cleaning such as SPM (Sulfuric Peroxide Mixture) or mixture of both ashing and wet clean, and the hardmask 802 is removed, for example, by hot phosphorous acid. This exposes the top surface 708 of the active silicon layer 706 and the top surface 1006 of the thermal oxide layer 1002 which together provide a substantially level surface for the subsequent formation of additional masks for forming fins.

Figure 11:
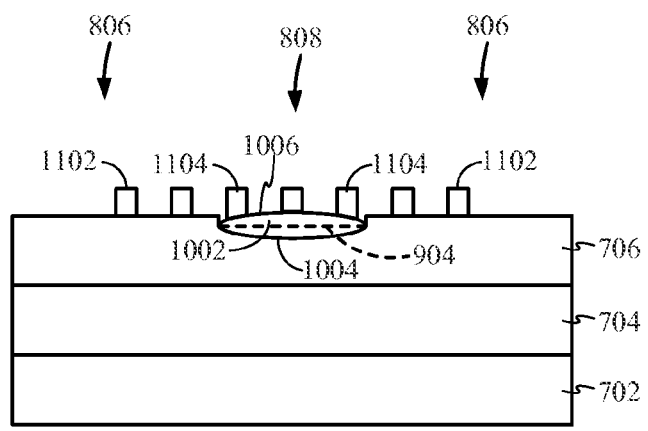
Figure 12:
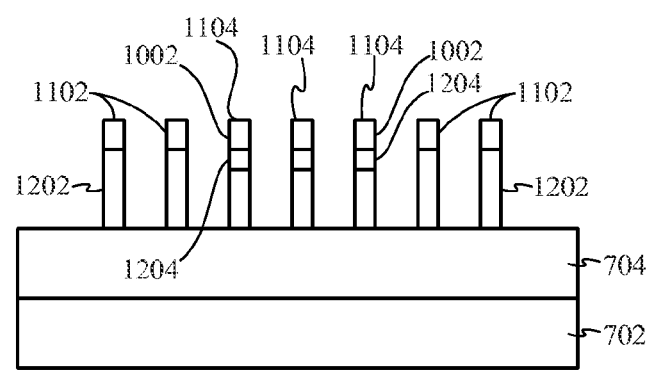

FIG. 11 illustrates a plurality of first masks 1102 formed on the top surface 708 of the active silicon layer 706 in the first portion 806 of the SOI wafer 700 and a plurality of second masks 1104 formed on the top surface 1106 of the thermal oxide layer 1002. These first and second masks 1102, 1104 define the locations and desired widths of a plurality of fins that will be formed beneath each of the masks 1102, 1104 during a further processing step in which the portions of the active silicon layer 706 that are not beneath a first mask 1102 or a second mask 1104 and the portions of the thermal oxide layer 1002 that are not beneath a second mask 1104 are removed. The result, as illustrated in FIG. 12, is a plurality of first fins 1202 beneath each of the plurality of first masks 1102 and a plurality of second fins 1204 beneath each of the plurality of second masks 1104 which second fins 1204 are shorter than the plurality of first fins 1202. A finFET is formed from these different-height fins in a conventional manner. Beneficially, the foregoing method produces a substantially level surface, comprising the top surface 708 of the active silicon region and the top surface 1006 of the thermal oxide layer 1002, on which the first and second plurality of masks 1102, 1104 can then be formed. This smooth surface may lead to more accurate mask placement and better consistency in the heights of the first plurality of fins 1202 and in the heights of the second plurality of fins 1204. For example, considering a process integration flow that maintains the thermal oxide layer 1002 on top of the short fins 1204 in a downstream process, aligned fin height makes process integration such as gate etch and spacer etch easier due to one single aspect ratio of the fins themselves (including thermal oxide layer 1002) and also fin-to-fin space aspect ratio.

Figure 13:
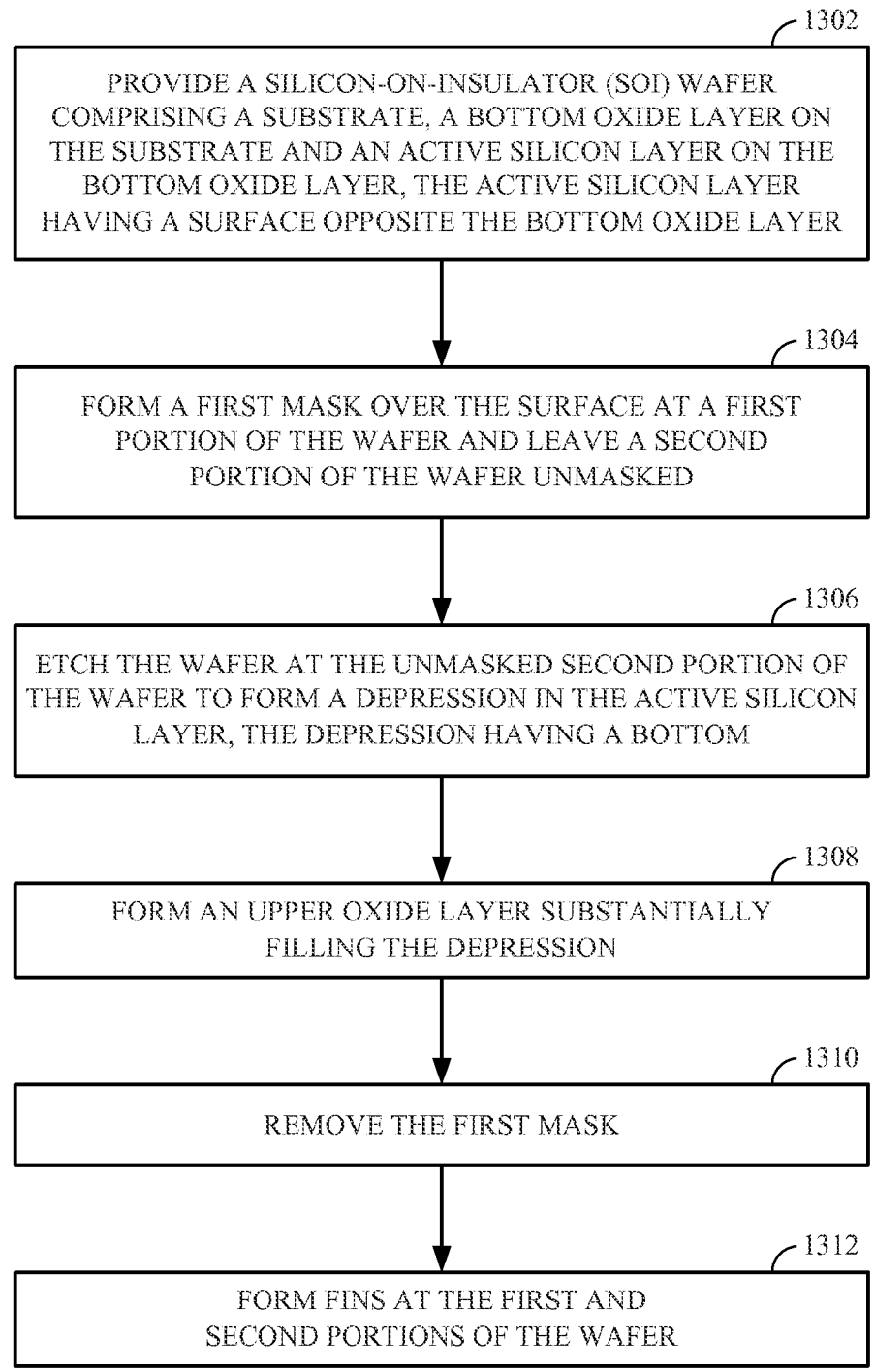
FIG. 13 is a flow chart illustrating a method according to an embodiment.

FIG. 13 illustrates a method according to an embodiment that includes a block 1302 of providing a silicon-on-insulator (SOI) wafer comprising a substrate, a bottom oxide layer on the substrate and an active silicon layer on the bottom oxide layer, where the active silicon layer has a surface opposite the bottom oxide layer. The method also includes a block 1304 of forming a first mask over the surface at a first portion of the wafer and leaving a second portion of the wafer unmasked, and a block 1306 of etching the wafer at the unmasked second portion of the wafer to form a depression in the active silicon layer, the depression having a bottom. In addition, the method includes a block 1308 of forming a thermal oxide layer substantially filling the depression, a block 1310 of removing the first mask, and a block 1312 of forming fins at the first and second portions of the wafer.

Figure 14:
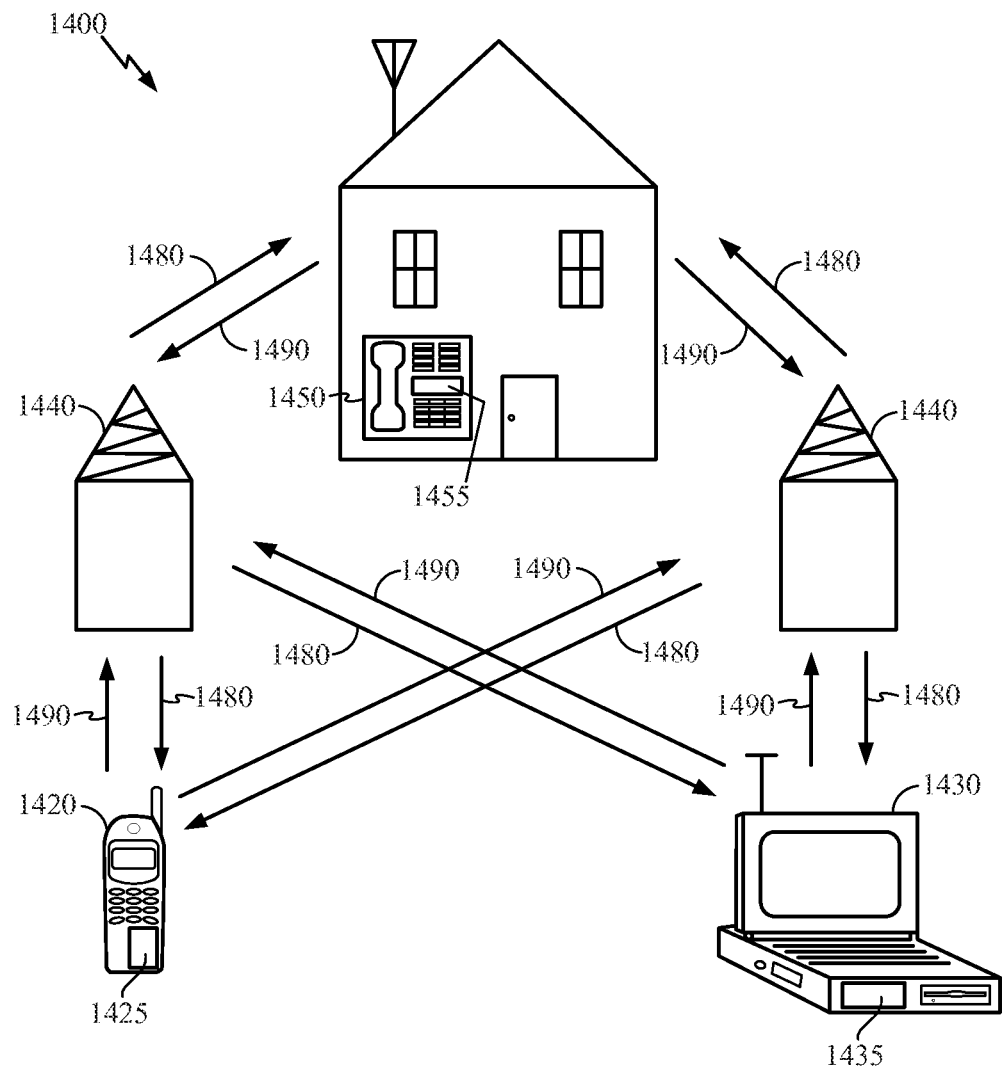
FIG. 14 is a schematic diagram of an exemplary wireless communication system in which embodiments of the disclosure may be used.

FIG. 14 illustrates an exemplary wireless communication system 1400 in which one or more embodiments of the disclosure may be advantageously employed. For purposes of illustration, FIG. 14 shows three remote units 1420, 1430, and 1450 and two base stations 1440. It will be recognized that conventional wireless communication systems may have many more remote units and base stations. The remote units 1420, 1430, and 1450 include integrated circuit or other semiconductor devices 1425, 1435 and 1455 (including finFET's with fins of different height as disclosed herein), which are among embodiments of the disclosure as discussed further below. FIG. 14 shows forward link signals 1480 from the base stations 1440 and the remote units 1420, 1430, and 1450 and reverse link signals 1490 from the remote units 1420, 1430, and 1450 to the base stations 1440.

In FIG. 14, the remote unit 1420 is shown as a mobile telephone, the remote unit 1430 is shown as a portable computer, and the remote unit 1450 is shown as a fixed location remote unit in a wireless local loop system. For example, the remote units may be any one or combination of a mobile phone, hand-held personal communication system (PCS) unit, portable data unit such as a personal digital or data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 14 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a finFET having fins with different heights. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method comprising:
   providing a silicon-on-insulator (SOI) wafer comprising a substrate, a bottom oxide layer on the substrate and an active silicon layer on the bottom oxide layer, the active silicon layer having a surface opposite the bottom oxide layer;
   forming a first mask over the surface at a first portion of the wafer and leaving a second portion of the wafer unmasked;
   etching the wafer at the unmasked second portion of the wafer to form a depression in the active silicon layer, the depression having a bottom;
   forming a thermal oxide layer substantially filling the depression;
   removing the first mask; and
   forming fins at the first and second portions of the wafer, comprising forming a first plurality of second masks on the surface at the first portion of the wafer, forming a second plurality of second masks on the thermal oxide layer, and patterning the wafer to remove portions of the silicon layer not protected by the first plurality of second masks or the second plurality of second masks.

2. The method of claim 1 including, before forming the first mask, forming a hardmask over the surface and wherein etching the wafer at the unmasked second portion comprises etching through the hardmask and into the active silicon layer.

3. The method of claim 1, wherein forming a thermal oxide layer substantially filling the depression comprises forming a thermal oxide layer filling the depression to a level substantially even with the surface.

4. The method of claim 1, wherein forming a thermal oxide layer comprises oxidizing the bottom of the depression.

5. The method of claim 1, including, before forming the first mask, forming a hardmask over the surface, and wherein etching the wafer at the unmasked second portion comprises etching through the hardmask and into the active silicon layer, wherein forming a thermal oxide layer comprises oxidizing the bottom of the depression until a thermal oxide layer on the bottom of the depression is substantially even with the surface.

6. The method of claim 1, wherein forming fins at the first and second portions of the wafer comprises forming fins having a first height at the first portion of the wafer and forming fins having a second height, less than the first height, at the second portion of the wafer.

7. The method of claim 1, wherein etching the surface comprises performing a wet etch or performing a dry etch or performing both a wet etch and a dry etch.

8. The method of claim 1 including forming a finFET device using the fins.

9. A method comprising:
   steps for providing a silicon-on-insulator (SOI) wafer comprising a substrate, a bottom oxide layer on the substrate and an active silicon layer on the bottom oxide layer, the active silicon layer having a surface opposite the bottom oxide layer;
   steps for forming a first mask on the surface at a first portion of the wafer and leaving a second portion of the wafer unmasked;
   steps for etching the wafer at the unmasked second portion of the wafer to form a depression in the active silicon layer, the depression having a bottom;
   steps for forming a thermal oxide layer substantially filling the depression;
   steps for removing the first mask; and
   steps for forming fins at the first and second portions of the wafer, comprising forming a first plurality of second masks on the surface at the first portion of the wafer, forming a second plurality of second masks on the thermal oxide layer, and patterning the wafer to remove portions of the silicon layer not protected by the first plurality of second masks or the second plurality of second masks.

\* \* \* \* \*